United States Patent
Hijzen et al.

(10) Patent No.: US 6,359,308 B1
(45) Date of Patent: Mar. 19, 2002

(54) CELLULAR TRENCH-GATE FIELD-EFFECT TRANSISTORS

(75) Inventors: Erwin A. Hijzen, Breda; Raymond J.E. Hueting, Helmond, both of (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/624,481

(22) Filed: Jul. 24, 2000

(30) Foreign Application Priority Data

Jul. 22, 1999 (GB) ............................................. 9917099

(51) Int. Cl.$^7$ ............................................. H01L 29/76
(52) U.S. Cl. .................. 257/341; 257/330; 257/331; 257/332; 257/333; 257/334; 257/488; 257/496
(58) Field of Search ................................ 257/327–334, 257/341, 488, 496

(56) References Cited

U.S. PATENT DOCUMENTS

| | | | | |
|---|---|---|---|---|
| 4,835,584 A | * | 5/1989 | Lancaster | 257/330 |
| 5,014,099 A | * | 5/1991 | McElroy | 257/302 |
| 5,016,070 A | * | 5/1991 | Sundaresan | 257/302 |
| 5,111,253 A | * | 5/1992 | Korman et al. | 257/341 |
| 5,349,224 A | * | 9/1994 | Gilbert et al. | 257/333 |
| 5,350,934 A | * | 9/1994 | Matsuda | 257/139 |
| 5,614,751 A | * | 3/1997 | Yilmaz et al. | 257/394 |
| 5,637,898 A | | 6/1997 | Baliga | 257/330 |
| 5,723,891 A | * | 3/1998 | Malhi | 257/341 |
| 5,814,858 A | * | 9/1998 | Williams | 257/328 |
| 5,895,951 A | * | 4/1999 | So et al. | 257/330 |
| 5,998,833 A | | 12/1999 | Baliga | 257/329 |
| 5,998,837 A | * | 12/1999 | Williams | 257/341 |
| 6,066,877 A | * | 5/2000 | Williams et al. | 257/341 |
| 6,107,650 A | * | 8/2000 | Takahashi et al. | 257/139 |
| 6,140,678 A | * | 10/2000 | Grabowski et al. | 257/328 |
| 6,218,217 B1 | * | 4/2001 | Uenishi et al. | 438/138 |
| 6,255,692 B1 | * | 7/2001 | Haung | 257/341 |

FOREIGN PATENT DOCUMENTS

| | | |
|---|---|---|
| EP | 0746030 A2 | 12/1992 |
| EP | 0698919 A2 | 2/1996 |
| JP | 10214968 A | 8/1998 |
| WO | 9734324 A1 | 9/1997 |

* cited by examiner

Primary Examiner—Eddie Lee
Assistant Examiner—JoséR. Diaz
(74) Attorney, Agent, or Firm—Steven R. Biren

(57) ABSTRACT

A cellular trench-gate field-effect transistor comprises a field plate (38) on dielectric material (28) in a perimeter trench (18). The dielectric material (28) forms a thicker dielectric layer than the gate dielectric layer (21) in the array trenches (11). The field plate (38) is connected to the source (3) or trench-gate (31) of the transistor and acts inwardly towards the cellular array rather than outwardly towards the body perimeter (15) because of its presence on the inside wall 18a of the trench (18) without acting on any outside wall (18b). The array and perimeter trenches (11,18) are sufficiently closely spaced, and the intermediate areas (4a, 4b) of the drain drift region (4) are sufficiently lowly doped, that the depletion layer (40) formed in the drain drift region (4) in the blocking state of the transistor depletes the whole of these intermediate areas between neighbouring trenches at a voltage less than the breakdown voltage. This arrangement reduces the risk of premature breakdown that can occur at high field points in the depletion layer (40), especially at the perimeter of the cellular array.

10 Claims, 3 Drawing Sheets

CELLULAR TRENCH-GATE FIELD-EFFECT TRANSISTORS

BACKGROUND OF THE INVENTION

This invention relates to cellular trench-gate field-effect transistors, and more particularly to measures for increasing the breakdown voltage of such transistors. The invention also relates to methods of manufacturing such transistors.

Cellular trench-gate field-effect transistors are known, comprising a semiconductor body having an array of transistor cells, in which the cells are bounded by a pattern of trenches lined with dielectric material within the array and around the perimeter of the array. The array trenches extend from a surface of the body through a body region of a first conductivity type into an underlying drain drift region of an opposite second conductivity type. The dielectric material in the array trenches provides a gate dielectric layer adjacent to the body region. A gate electrode on the gate dielectric layer provides a trench-gate in the array trenches, for controlling current flow in a conduction channel from a source region at the surface of the body to the drain drift region in a conductive state of the transistor. A depletion layer is formed in the drain drift region from the p-n junction with the body region and from the trench-gate in a blocking state of the transistor. Premature breakdown of these transistors can occur at high field points in the depletion layer, especially at the perimeter of the array.

It is also known to provide a field plate on the dielectric material in the perimeter trench. Such a transistor with the field-plate connected to its trench-gate is known from the English-language abstract in Patent Abstracts of Japan of JP-A-10214968, the whole contents of which are hereby incorporated herein as reference material. The perimeter trench has an inside wall around the drain drift region of the array and an outside wall on an opposite side of the trench. The perimeter trench is shown as having the same width as the array trenches. The same dielectric layer is shown in the perimeter trench and in the array trenches, so that the field-plate is effectively an extension of the trench-gate. This field relaxation arrangement is adopted to enable a thin gate dielectric to be used without lowering the withstand voltage of the gate.

SUMMARY OF THE INVENTION

It is an aim of the present invention to reduce the premature breakdown of cellular trench-gate field-effect transistors that can occur at high field points in the depletion layer, especially at the perimeter of the cellular array.

According to the present invention, there is provided a cellular trench-gate field-effect transistor comprising a field plate on dielectric material in a perimeter trench, characterised in that the dielectric material in the perimeter trench forms a thicker dielectric layer than the gate dielectric layer in the array trenches, and the field plate is present on this thicker dielectric on the inside wall of the perimeter trench without acting on any outside wall. This perimeter field plate is connected to one of the source and trench-gate of the transistor. Furthermore, the array and perimeter trenches are sufficiently closely spaced (and the intermediate areas of the drain drift region are sufficiently lowly doped) that the depletion layer formed in the drain drift region in the blocking state of the transistor depletes the whole of the intermediate areas of the drain drift region between neighbouring trenches at a voltage less than the breakdown voltage.

Thus, the trench-gate trenches and the inwardly-acting field-plate trench are so constructed and arranged in a transistor in accordance with the invention as to reduce the high field points by depleting the areas of the drain drift region between the trenches, without any significant outward extension. This depletion arrangement uses the field-plate and trench-gates in a particular form of the so-called "RESURF" technique. Particular advantageous forms of this construction and arrangement can be achieved without requiring extra processing steps in manufacture. In particular, the perimeter trench can be made deeper than the other trenches by making it wider. Due to local loading effects during etching of the array trenches, this increased width can be used to produce automatically a deeper perimeter trench. A thick dielectric used for passivating the trench pattern can be used in the deep trench as the field-plate dielectric. Different dielectric thicknesses can also be advantageously used in the trenches and in different portions of the trenches.

Some of the particularly advantageous technical features and some of the options available with the invention are set out in the appended Claims. These features not only improve the transistor characteristics, but several permit manufacture in a simpler and more cost effective manner. Thus, for example, the perimeter trench may extend to the perimeter of the body, so providing no outside wall and requiring less semiconductor body area. The transistor body region can also extend to the perimeter and so be formed from a non-localised (blanket) dopant implantation and/or diffusion at the body surface or from a doped epitaxial layer.

BRIEF DESCRIPTION OF THE DRAWING

These and other features are illustrated in embodiments of the present invention which are now described, by way of example, with reference to the accompanying diagrammatic drawings. In these drawings.

Figure 1:
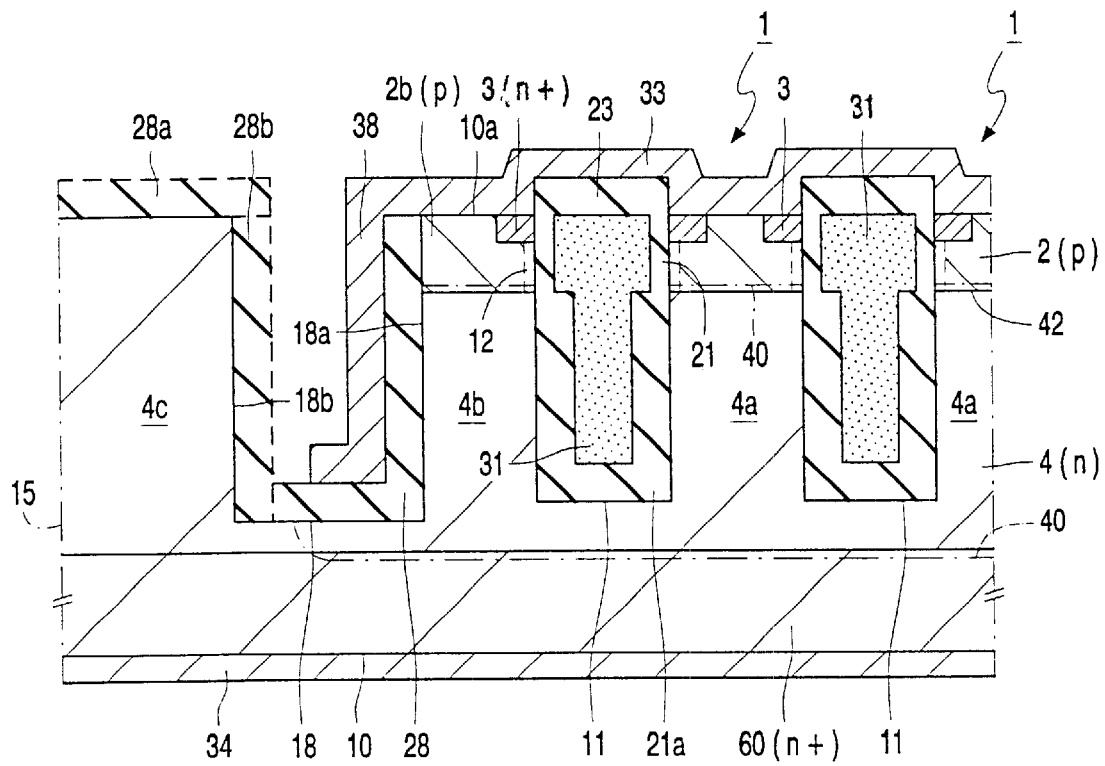
FIG. 1 is a cross-sectional view of part of a cellular trench-gate field-effect transistor in accordance with the invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

The cellular trench-gate field-effect transistors of FIGS. 1, 2 and 3 and 4 each comprise a semiconductor body 10 having an array of transistor cells 1. The cells 1 are bounded by a network of trenches 11,18 lined with dielectric material 21, 28. Trenches 11 extend within the array, and the trench 18 extends around the perimeter of the array. The transistor typically comprises tens of thousands of parallel cells 1 in the semiconductor body 10 adjacent to the body surface 10a. The number of cells is dependent on the desired current-carrying capability of the device.

The array trenches 11 extend from the surface 10a through a transistor body region 2 of a first conductivity type (p-type in this example) into an underlying drain drift region 4 of an opposite second conductivity type (n-type in this example). The dielectric material 21 in the array trenches 11 provides a gate dielectric layer 21 adjacent to the body region 2. A gate electrode 31 on the gate dielectric layer 21 provides the trench-gate in the array trenches 11 for controlling current flow in a conduction channel 12 from a source region 3 at the surface 10a to the drain drift region 4 in a conductive state of the transistor. Apart from the close spacing of the trenches 11 as described below, the transistor cells and their array are of known MOSFET type. The body region 2 separates the source and drain-drift regions 3 and 4. The application of a voltage signal to the gate 11 in the on-state of the device serves in known manner for inducing the conduction channel 12 in a channel-accommodating portion of the body region 2 adjacent to the trench-gate structure 31,21 and for controlling current flow in this conduction channel 12 between the source and drain-drift regions 3 and 4.

Figure 2:
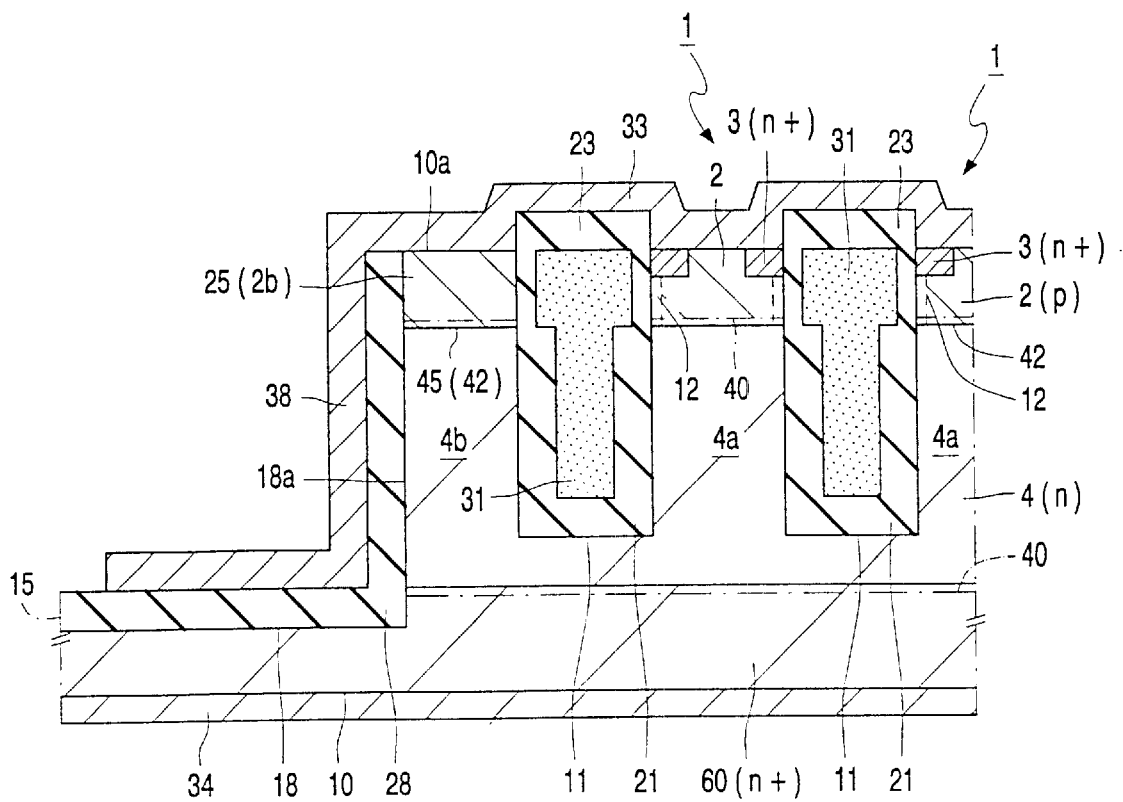
FIGS. 2 and 3 are similar cross-sectional views of part of two other cellular trench-gate field-effect transistors also in accordance with the invention.
Figure 3:
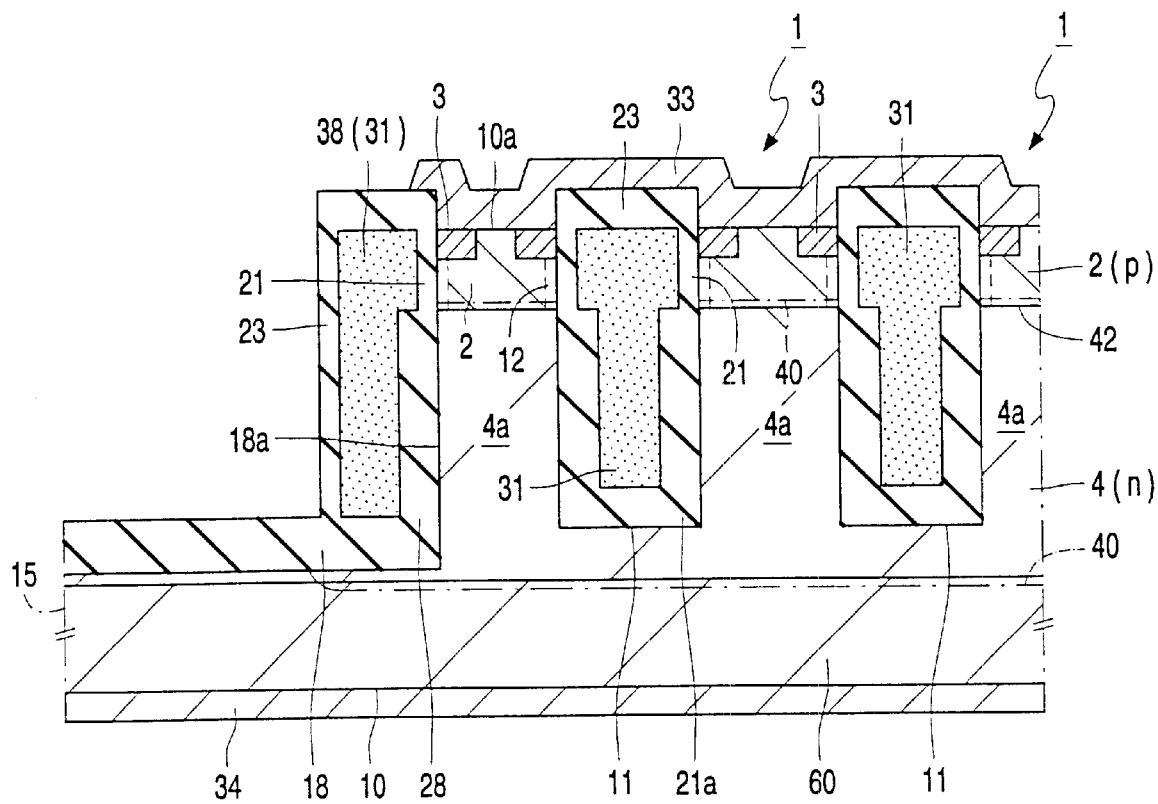

The source region 3 is shown in FIGS. 1 to 3 as a semiconductor region (n+) overdoping part of the body region 2. However, some transistors may alternatively have a Schottky metal source at the body surface 10a. The source regions 3 of the different cells 1 and the adjacent surface of their body regions 2 are contacted by a source electrode 33. The source electrode 33 extends on an insulating layer 23 on the trench-gate structure 31,21. By way of example, FIGS. 1 to 3 show a discrete vertical device structure in which the drain-drift region 4 may be formed by an epitaxial layer of high resistivity on a highly doped substrate 60. This substrate 60 is of the same conductivity type (n-type in this example) as the region 4 and provides the highly conductive drain region that is contacted at the bottom major surface 10 of the device body by a drain electrode 34.

Transistors in accordance with the invention may have any one of a variety of known cell geometries, for example an hexagonal close-packed geometry, or a square geometry, or a stripe geometry. The trench-gate structure 31,21 extends laterally around the boundary of each cell, as a common insulated-gate electrode of the array. Thus, the trench-gate structure 31,21 laterally bounds the regions 2 and 3 in these cells, and part of the drain drift region 4. It should be understood that the trenches 11 illustrated in the cross-section of FIGS. 1 to 4 are not separate from each other but are connected together in a single trench network outside of the plane of the paper. However, when describing the width of a cell 1 between its trench-gate boundary, it is convenient to speak of the trenches 11 at each side of the cell. It is also convenient to speak of trenches 11 when referring to the spacing between cells 1. The drain drift region 4 is also common to all the cells 1.

In a blocking state of the transistor, a depletion layer 40 is formed in the drain drift region 4 from the p-n junction 42 with the body region 2 and from the trench-gate structure 31,21. The extent of this depletion layer 40 is indicated in chain dot outline (-•-) in FIGS. 1 to 3. Thus, the depletion layer 40 extends across the whole of the drain drift region 4 between the trenches 11,18 and also slightly into the higher-doped substrate 60 and the transistor body region 2. Although FIGS. 1 to 3 show also the conduction channel 12 of the on state, it will be understood that channel 12 is not present in the blocking state. Similarly the voltage-sustaining depletion layer 40 is not present in the on state.

In the transistors of FIGS. 1 to 3 in accordance with the present invention, the array trenches 11 are sufficiently closely spaced and the intermediate areas 4a of the drain drift region 4 are sufficiently lowly doped that the depletion layer 40 depletes the whole of the intermediate areas 4a of the drain drift region 4 between neighbouring trenches 11 at a blocking voltage less than the breakdown voltage. Thus, with their small lateral dimensions, the breakdown voltage in the cells 1 is increased by means of the RESURF effect. This is caused by a field plate effect of the trench-gate structure 31,21 of the neighbouring cells on the drift region 4. At the edge of the trench-gate network, however, this gate effect is not present, so that in the absence of the field plate 38 in accordance with the invention premature breakdown could occur in the area 4b adjacent to the outermost trench 11.

This premature edge breakdown is avoided by the provision of a field plate 38 around the array perimeter in a manner in accordance with the invention. The field plate 38 is present on the dielectric material 28 in the perimeter trench 18, but only on its inside wall 18a without effectively extending as a field plate on any outside wall 18b of the perimeter trench. The dielectric material 28 forms a thicker dielectric layer than the gate dielectric layer 21. The field plate 28 is connected to one of the source 3 and trench-gate 31 of the transistor. By way of example, FIGS. 1 and 2 show the field plate 38 connected to the source 3 by a simple extension of the source electrode 33. FIG. 3 shows the field plate 38 connected to the gate 31, for example by an extension of the trench-gate network 31 around the perimeter wall 18a. A gate connection of the field plate 38 may also be adopted in a modification of the devices of FIGS. 1 and 2.

The depletion layer 40 formed in the drain drift region 4 from the p-n junction 42 and from the trench-gate 11 is also controlled by this perimeter field-plate 28 in the blocking state of the transistor. The perimeter trench 18 is sufficiently closely spaced to the outermost array trench 11 (and the intermediate area 4b or 4a of the drain drift region 4 is sufficiently lowly doped) that the depletion layer 40 also depletes the whole of the intermediate area 4b or 4a of the drain drift region 4 between the neighbouring trenches 18 and 11 at the blocking voltage which is less than the breakdown voltage. The field plate 38 acts inwardly towards the array, without significantly spreading the depletion layer 40 outwardly towards the perimeter 15 of the semiconductor body 10. This is a result of the field plate not being located on any outside wall 18b of the perimeter trench 18. The resulting depletion of the intermediate area (4b in FIGS. 1 and 2 and 4a in FIG. 3) between the trenches 11,18 reduces the electric field around the perimeter of the outermost active cell 1, while avoiding any breakdown towards the perimeter 15 of the body 10.

In the transistors of FIGS. 1 to 3, the perimeter trench 18 extends deeper in the body 10 than the array trenches 11 and is wider than the array trenches 11. Since the electric field in the bottom of this deep trench 18 is larger, the dielectric 28 in the trench 18 needs to be thicker than the gate dielectric 21 in the active cells 1.

Many modifications and variations are possible within the scope of the present invention. Several such modifications are illustrated in the separate embodiments of FIGS. 1, 2 and 3. It will be evident that alternative features which are shown in one embodiment may be adopted in another of the embodiments.

In the transistor of FIG. 1, the deeper and wider trench 18 is spaced from the perimeter 15 of the semiconductor body 10 by a peripheral area 4c of the drain drift region 4. Thus, this perimeter trench 18 has an outside wall 18b, as illustrated in FIG. 1. FIG. 2 illustrates a specific embodiment having a simpler and more compact layout geometry. In the FIG. 2 transistor, the perimeter trench 18 is so deep as to extend through the thickness of the drain drift region 4 to the higher conductivity substrate 60. Furthermore, this perimeter trench 18 is so wide as to extend to the perimeter 15 of the body 10. Thus, the FIG. 2 device has no outside wall 18b to its perimeter trench 18.

Thus, it is not necessary for the perimeter trench 18 (that extends around the cellular array) to be spaced from the perimeter 15 of the body 10. Furthermore, in the FIG. 1 device, the dielectric layer 28a on the surface 10a of the peripheral area 4c can be omitted, and even the dielectric layer 28b on the outside wall 18b of the perimeter trench 18 could be omitted. The omission of these dielectric layers 28a and 28b is possible because of the peripheral isolating effect of avoiding any field plate action in an outward direction from the trench 18 towards the perimeter 15 of the body 10. This peripheral isolation can still be achieved if the gap shown in the perimeter trench 18 in FIG. 1 were to be filled with an insulating material of sufficiently low dielectric constant and large thickness that there is no significant capacitive coupling between the field plate 38 and the peripheral portion 4c at the outside wall 18b.

By way of example, FIG. 1 illustrates a transistor in which an active cell portion 2b of the transistor body region 2 is present between the outer cells 1 of the array and the perimeter trench 18. This outer active portion 2b of the transistor body region 2 has a source region 3 at the surface 10a adjacent to the trench-gate structure 31,21.

Instead of an active cell portion 2b, it is also possible to provide other features in this area between at least one of the outer cells 1 and the perimeter trench 18. Thus, for example, FIG. 2 shows a perimeter region 25(2b) of the first conductivity type (p type in this example) between the outer cells 1 of the array and the perimeter trench 18. This region 25(2b) forms a p-n junction 45(42) with the drain drift region 4 and so isolates the drain drift region from the source electrode 33 in this area. The region 25(2b) may be a peripheral extension area of the body region 2. Thus, the body region 2 may be formed as a blanket layer (for example, an epitaxial layer) adjacent the whole of the surface 10a. However, instead of or in addition to providing the region 25(2b), the peripheral area 4c of the drain drift region 4 may be isolated from the source electrode 33 by providing a thick insulating layer on the surface 10a in this perimeter area.

It is advantageous to provide a protective p-n junction diode in parallel with the active cells 1. In this case, the protective diode may be formed in at least a part of the perimeter area, by the inclusion of a region 25, which is of the same conductivity type as the transistor body region 2 but more highly doped (p+). The region 25 is contacted by the source electrode 33 and forms a p-n junction 45 with the area 4b of the drain drift region 4. The p-n junction 45 may be located deeper in the body 10 than the p-n junction 42. The p-n junction 45 functions as an avalanche diode that turns on at the breakdown voltage to prevent possible turn-on of the parasitic bipolar n-p-n transistor between MOSFET regions 3,2,4. The thick dielectric layer 28 of the perimeter trench 18 is present between the perimeter field plate 38 and this avalanche diode junction 45. The p+ region 25 may over-dope a peripheral extension 2b of the body region 2.

However, instead of or in addition to providing the avalanche diode in this perimeter area, it may be provided within the array by replacing one or more active cells 1 with a highly-doped region 25 forming a deeper p-n junction 45 than the junction 42 of the active cells.

In the devices of FIGS. 1 and 2, the field plate 38 is connected to the source electrode 33. The thick dielectric layer 28 of the perimeter trench 18 is present between this source field plate 38 and the perimeter body region 2' and/or diode region 25. The perimeter trench 18 is completely separated from the array trenches 11 by the intermediate drain drift region 4 and the body region and/or diode region 25. FIG. 3 illustrates a different situation in which the array trenches 11 may run into the deeper and wider perimeter trench 18. The transistor of FIG. 3 has its field plate 38 connected to the trench-gate 31. The thicker dielectric 28 in its perimeter trench 18 is thinner adjacent to the portion 2 of the transistor body region between the outer cells 1 of the array and the perimeter trench 18 and forms a gate dielectric 21 in this area. A source region 3 is present at the surface 10a adjacent to the perimeter trench 18. In this case, the upper part of the field plate 38 acts as a gate for controlling current flow in a conduction channel 12 in the body region 2 adjacent to the perimeter trench 18. This configuration increases the current-carrying capability of the transistor and reduces the on-resistance between source and drain.

The transistors of FIGS. 1 to 3 can be manufactured using known technologies.

Typically the device body 10 is of monocrystalline silicon, with the gate 31 of conductive polycrystalline silicon on an insulating layer 21 of silicon dioxide. The electrodes 33 and 34 may be of, for example, aluminum. In a specific exemplary embodiment, the doping concentration (n) of the drain drift region 4 may be, for example, of the order of $10^{16}$ to $10^{17}$ phosphorus or arsenic atoms cm$^{-3}$, that (n+) of the drain substrate 60 and source region 3 may be, for example, $10^{20}$ to $10^{21}$ phosphorus or arsenic atoms cm$^{-3}$, and that (P) of the channel-accommodating portion of the body region 2 may be, for example, $10^{16}$ to $10^{17}$ boron atoms cm$^{-3}$. In such an embodiment, the depth (below the surface area 10a) of the body region 2 may be, for example, about 1 μm (micrometer), and the drift region 4 may have a thickness of, for example, 3 to 5 μm between the region 2 and the substrate 60. The depth of the array trench 11 may be, for example, 3 to 5 μm, whereas that of the perimeter trench may be about the same or deeper. The close spacing of the transistor cells 1 and perimeter trench 18 may be such as to provide a width of, for example, 0.5 μm to 1 μm for the intermediate parts 4a and 4b of the drain drift region 4. Thus, if the array trench 11 is 0.5 μm to 1 μm wide, then the transistor has a cell pitch of 1 μm to 2 μm, i.e. with a spacing of 1 μm to 2 μm between centres of the neighbouring trenches 11. When an avalanche diode is included, the doping concentration (p+) of the high-doped region 25 may be, for example, $10^{18}$ to $10^{19}$ boron atoms cm$^{-3}$.

Figure 4:
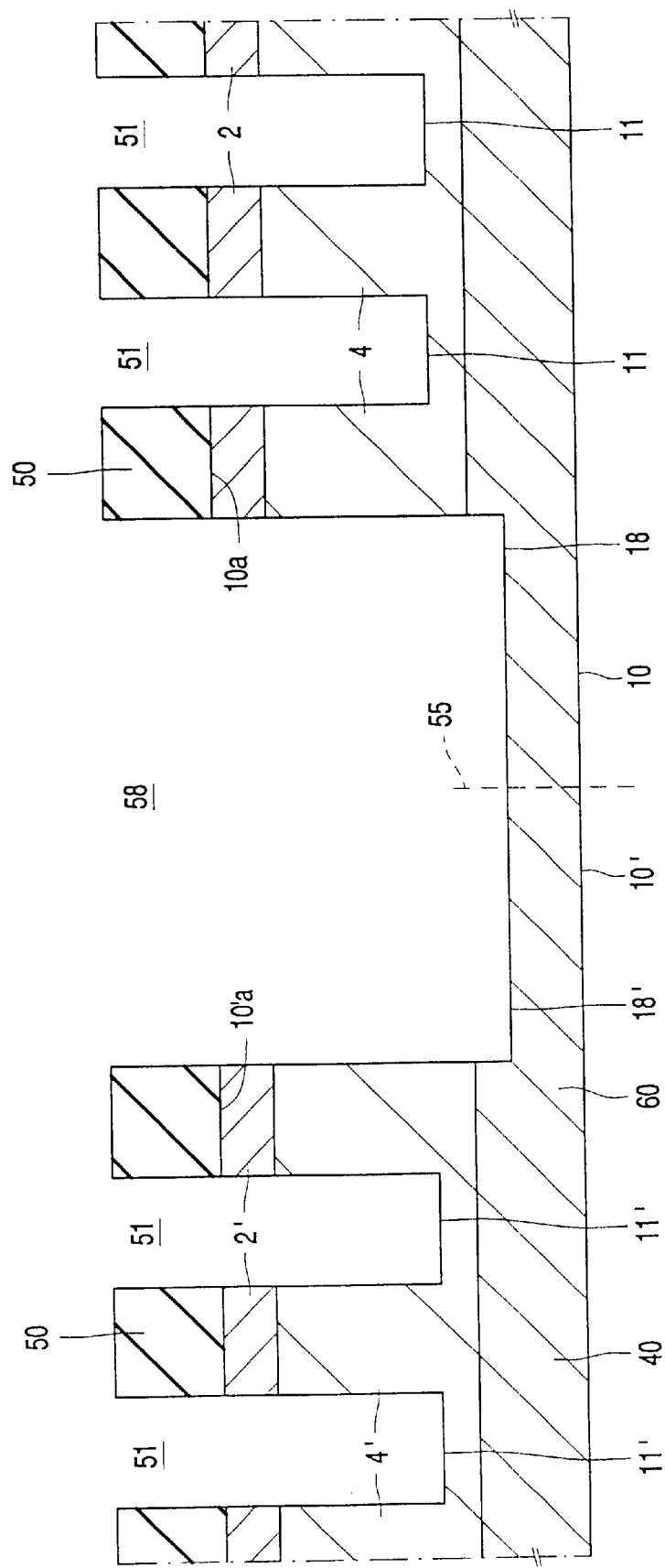
FIG. 4 is a cross-sectional view of part of a semiconductor wafer comprising two body parts of FIG. 2 or 3, at a stage in the manufacture of the cellular trench-gate field-effect transistors of FIG. 2 or FIG. 3 by a method in accordance with the invention.

The device structures of FIGS. 1 to 3 can be manufactured without requiring additional masking and processing steps to fabricate the perimeter field-plate structure 38,28,18. Thus, FIG. 4 illustrates a manufacturing stage, in which a wider, deeper perimeter trench 18 and the array trenches 11 are etched into the semiconductor body 10 using the same process steps and via respective windows 58 and 51 in a masking pattern 50 on the surface 10a of the body 10. The windows 51 for the array trenches 11 are so narrow as to restrict the etch rate for the array trenches 11 as compared with a wider window 58 for the perimeter trench 18. Thus, this process exploits to its advantage the well-known phenomenon of a so-called "loading effect", in which the etch rate is dependent on the amount of etchable surface exposed to the etchant.

The field-plate 38 in the perimeter trench 18 is only inwardly acting. This permits the transistor body region 2 to be formed from a doped layer adjacent the whole of the surface 10a, i.e. a so-called "blanket" layer that extends to the perimeter of the body 10 and so avoids any need for a masking pattern on the surface 10a. This blanket layer may be, for example, a doped epitaxial layer, or it can be formed from a non-localised (blanket) dopant implantation and/or diffusion at the body surface 10a. In either case, the trenches 11 and 18 are etched through the thickness of the doped layer 2 and into the underlying drift region 4.

In the devices of FIGS. 2 and 3, the perimeter trench 18 extends to the perimeter 15 of the body, and so the individual device bodies manufactured side-by-side in the wafer share a common double-width trench 18,18' around their individual perimeters. In this case, the separate bodies 10 are formed at a final stage in manufacture, by dividing the wafer along scribe-lanes 55 along the field-plate structure in the bottom of the common double-width trench 18,18'. Correspondingly parts of the neighbouring device body in FIG. 4 are given the same reference signs as those of the body of FIGS. 1 to 3, but followed by an apostrophe.

The transistor cells 1 are fabricated in known manner with their insulated-gate structure 21,31 in the array trenches 11. The thick dielectric layer 28 of the perimeter trench 18 may be formed in the same process steps as the insulating capping layer 23. The field-plate 38 may be an extension of the source metallisation 33 or of the polycrystalline gate 31.

Many more modifications and variations are possible within the scope of the present invention. Instead of being deeper, the perimeter trench 18 may be of the same depth as the array trenches 11. The drift region 4 may have a uniform doping concentration (n). Furthermore, the dielectric layer 21 in the active gate trenches 11 may be of substantially uniform thickness, as illustrated in FIG. 2. However, in order to reduce the on-resistance of the device, the drain drift region 4 may have a doping concentration (n) that increases with depth. Thus, the doping concentration (n) of the drift region 4 may increase from, for example, $1\times10^{16}$ cm$^{-3}$ adjacent to the p-n junction 42 to, for example, $3\times10^{17}$ cm$^{-3}$ adjacent to the interface with the substrate 60. So as to reduce the higher field then present at the bottom of the trenches, the dielectric material 21a in the array trenches 11 adjacent the increased doping concentration of the drain drift region 2 is preferably made thicker than the gate dielectric layer 21, as illustrated in FIGS. 1 and 3. Such an active cell configuration of thicker dielectric 21a and increased doping concentration is known from U.S. Pat. No. 5,637,898, the whole contents of which are hereby incorporated herein as reference material. The array trenches 11 with the thicker lower dielectric 21a may even extend deeper, for example slightly into the higher doped substrate 60.

Depending on the desired device characteristics, the perimeter trench 18 in FIGS. 1 and 3 may extend into the substrate 60. It may be deeper than, or be of the same depth as, the array trenches 11. FIGS. 1 and 3 illustrate an intermediate situation where the trench 18 is deeper than the array trenches 11 but shallower than the interface of the drift region 4 with the substrate 60. The dielectric material 28 of the perimeter trench 18 forms a thicker dielectric layer than the gate dielectric 21 so as to provide a reduced capacitive coupling between the perimeter field-plate 38 and the drift region 4 as compared with that between the trench-gate 31 and the transistor body region 2. The thicker dielectric 28 of the FIGS. 1 and 3 devices may be formed, for example, in the same process steps as the thicker dielectric material 21a in the array trenches 11. Thus, dielectric material 28 may be of the same thickness as the dielectric material 21a.

A vertical discrete device has been described with reference to FIGS. 1 to 3, having its second main electrode 34 contacting a substrate 60 at the back surface 10b of the body 10. However, an integrated device is also possible in accordance with the invention. In this case, the highly conductive region 60 may be a doped buried layer between a device substrate and an epitaxial region 4 and may be contacted by electrode 34 at the front major surface 10a via a doped peripheral contact region which extends from the surface 10a to the depth of the buried layer.

An n-channel device has been described with reference to FIGS. 1 to 3. However, a p-channel device is also possible in accordance with the invention, in which the regions 3, 4, 40 are p-type, the region 2 (and 25) is n-type and the conduction channel 12 is of holes.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A cellular trench-gate field-effect transistor comprising a semiconductor body having an array of transistor cells, the cells being bounded by a pattern of trenches lined with dielectric material within the array and around the perimeter of the array, the array trenches extending from a surface of semiconductor body through a body region of a first conductivity type into an underlying drain drift region of an opposite second conductivity type, the perimeter trench having an inside wall around the drain drift region of the array, the dielectric material in the array trenches providing a gate dielectric layer adjacent to the body region, a gate electrode on the gate dielectric layer so as to provide a trench-gate in the array trenches for controlling current flow in a conduction channel from a source region at the surface of the body to the drain drift region in a conductive state of the transistor, and a field plate on is dielectric material in the perimeter trench, a depletion layer being formed in the drain drift region of the array from the a p-n junction the body region, from the trench-gate and from the field-plate in a blocking state of the transistor, characterised in that the dielectric material in the perimeter trench forms a thicker dielectric layer than the gate dielectric layer, in that the field plate is connected to one of the source and trench-gate of the transistor and is present on said thicker dielectric layer on said inside wall of the perimeter trench without acting on any outside wall, and in that the array and perimeter trenches are sufficiently closely spaced and the intermediate areas of the drain drift region are sufficiently lowly doped that the depletion layer formed in the drain drift region in the blocking state of the transistor depletes the whole of the intermediate areas of the drain drift region between the trenches at a voltage less than the breakdown voltage.

2. A transistor as claimed in claim 1, further characterised in that the perimeter trench extends deeper in semiconductor body than the array trenches.

3. A transistor as claimed in claim 2, further characterised in that the drain drift region is present on a higher conductivity substrate of the second conductivity type, and the perimeter trench extends through the thickness of the drain drift region to the substrate.

4. A transistor as claimed in claim 1, further characterised in that the perimeter trench is wider than the array trenches.

5. A transistor as claimed in claim 4, further characterised in that the perimeter trench extends to the perimeter of the semiconductor body and so provides no outside wall.

6. A transistor as claimed in claim 1, further characterised in that a portion of the body region is present between the outer cells of the array and the perimeter trench and has a source region at the surface of semiconductor body adjacent to the trench-gate.

7. A transistor as claimed in claim 6, further characterised in that the field plate is connected to the trench-gate, the thicker dielectric in the perimeter trench is thinner adjacent the portion of the body region between the perimeter trench and the outer cells of the array and forms a gate dielectric, and a source region is present at the surface of semiconductor body adjacent to the perimeter trench.

8. A transistor as claimed in claim 1, further characterised in that a region of the first conductivity type is present between at least one outer cell of the array and the perimeter trench and forms the p-n junction with the drain drift region.

9. A transistor as claimed in claim 1, further characterised in that the drain drift region has a doping concentration of the second conductivity type that increases with depth, and the dielectric material in the array trenches adjacent the increased doping concentration of the drain drift region is thicker than the gate dielectric layer.

10. A transistor as claimed in claim 9, further characterised in that the thicker dielectric material in the array trenches is of the same thickness as the thicker dielectric layer in the perimeter trench.

* * * * *